United States Patent
Wu et al.

(10) Patent No.: US 9,136,226 B2
(45) Date of Patent: Sep. 15, 2015

(54) IMPURITY DOPED UV PROTECTION LAYER

(75) Inventors: Zhen-Cheng Wu, Hsinchu (TW);
Yung-Cheng Lu, Taipei (TW);
Chung-Chi Ko, Nantou (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 640 days.

(21) Appl. No.: 12/774,569

(22) Filed: May 5, 2010

(65) Prior Publication Data
US 2010/0213518 A1    Aug. 26, 2010

Related U.S. Application Data (62) Division of application No. 11/039,161, filed on Jan. 20, 2005, now Pat. No. 7,732,923.

(60) Provisional application No. 60/640,695, filed on Dec. 30, 2004.

(51) Int. Cl.
*H01L 21/31* (2006.01)
*H01L 23/552* (2006.01)

(52) U.S. Cl.
CPC ....... *H01L 23/552* (2013.01); *H01L 2924/0002* (2013.01)

(58) Field of Classification Search
CPC ............ H01L 27/115; H01L 21/76834; H01L 21/76832; H01L 23/552; H01L 29/66825; H01L 21/28273; H01L 2924/0002; H01L 2924/00
USPC ..................................... 438/763; 257/E21.24
See application file for complete search history.

(56) References Cited

U.S. PATENT DOCUMENTS

| | | | | |
|---|---|---|---|---|
| 4,933,206 A | * | 6/1990 | Cox | 427/558 |
| 5,847,428 A | * | 12/1998 | Fulford et al. | 257/344 |
| 6,410,210 B1 | | 6/2002 | Gabriel | |
| 6,521,922 B1 | * | 2/2003 | Huang et al. | 257/288 |
| 6,656,778 B1 | * | 12/2003 | Chen et al. | 438/159 |
| 6,713,179 B2 | | 3/2004 | Veerasamy | |
| 6,720,081 B2 | | 4/2004 | Vitt et al. | |
| 6,720,118 B2 | | 4/2004 | Yan et al. | |
| 6,734,518 B2 | | 5/2004 | Yin et al. | |
| 6,737,747 B2 | | 5/2004 | Barth et al. | |
| 6,774,432 B1 | | 8/2004 | Ngo et al. | |
| 6,969,654 B1 | * | 11/2005 | Pham et al. | 438/261 |
| 7,091,088 B1 | | 8/2006 | Cheng et al. | |

(Continued)

OTHER PUBLICATIONS

Alavi, M., et al., "Effect of MOS Device Scaling on Process Induced Gate Charging," 1997 2nd International Symposium on Plasma Process-Induced Damage, May 13-14, 1997, pp. 7-10, American Vacuum Society New York, NY.

(Continued)

*Primary Examiner* — Duy T Nguyen
(74) *Attorney, Agent, or Firm* — Slater & Matsil, L.L.P.

(57) ABSTRACT

An ultra-violet (UV) protection layer is formed over a semiconductor workpiece before depositing a UV curable dielectric layer. The UV protection layer prevents UV light from reaching and damaging underlying material layers and electrical devices. The UV protection layer comprises a layer of silicon doped with an impurity, wherein the impurity comprises O, C, H, N, or combinations thereof. The UV protection layer may comprise SiOC:H, SiON, SiN, SiCO:H, combinations thereof, or multiple layers thereof, as examples.

19 Claims, 4 Drawing Sheets

(56) References Cited

U.S. PATENT DOCUMENTS

| | | | |
|---|---|---|---|
| 7,118,967 B1 | 10/2006 | Ngo et al. | |
| 2002/0146543 A1* | 10/2002 | Hooker | 428/195 |
| 2002/0195686 A1* | 12/2002 | Kim et al. | 257/621 |
| 2003/0098487 A1* | 5/2003 | Ngo et al. | 257/382 |
| 2004/0104419 A1* | 6/2004 | Bohr | 257/308 |
| 2004/0110325 A1* | 6/2004 | Yoo et al. | 438/142 |
| 2004/0151025 A1* | 8/2004 | Ngo et al. | 365/185.01 |
| 2005/0006712 A1 | 1/2005 | Ngo et al. | |
| 2006/0019500 A1 | 1/2006 | Luoh et al. | |
| 2006/0118892 A1* | 6/2006 | Wu et al. | 257/412 |

OTHER PUBLICATIONS

Brozek, T., et al., "Temperature Accelerated Gate Oxide Degradation Under Plasma-Induced Charging," IEEE Electron Device Letters, Jun. 1996, pp. 288-290, vol. 17, No. 6, IEEE, Los Alamitos, CA.

Chen, C.C., et al., "Plasma-Induced Charging Damage in Ultrathin (3-nm) Gate Oxides," IEEE Transactions on Electron Devices, Jul. 2000, pp. 1355-1360, Vo. 47, IEEE, Los Alamitos, CA.

Lin, H.C., "Characterization of Antenna Effect by Nondestructive Gate Current Measurement," Jpn. J. Appl. Phys., Aug. 15, 1996, pp. L.1044-L1046, vol. 35, Part 2, No. B.

Lin, H.C., et al., "Characterization of Plasma Charging Damage in Ultrathin Gate Oxides," 36th Annual International Reliability Physics Symposium, Reno, Nevada, 1998, pp. 312-317, IEEE, Los Alamitos, CA.

Min, B.W., et al., "Impact of Process-Induced Damage on MOSFET Reliability and Suppression of Damage by the Use of NO-based Oxynitride Gate Dielectrics," VLSI TSA, 1995, pp. 273-276.

Perera, A.H., et al., "A Versatile 0.13 µm CMOS Platform Technology Supporting High Performance and Low Power Applications," IEDM, 2000, pp. 571-574, IEEE, Los Alamitos, CA.

Song, S.C., et al., "Avoiding Plasma Induced Damage to Gate Oxide with Conductive Top Film (CTF) on PECVD Contact Etch Stop Layer," 2002 Symposium on VLSI Technology Digest of Technical Papers, 2002, pp. 72-73, IEEE, Los Alamitos, CA.

Tökei, Z., et al., "Reliability of Copper Dual Damascene Influenced by Pre-Clean," Proceedings of 9th IPFA 2002, Singapore, pp. 118-123, IEEE, Los Alamitos, CA.

* cited by examiner

IMPURITY DOPED UV PROTECTION LAYER

This application is a divisional of and claims priority to U.S. patent application Ser. No. 11/039,161, filed on Jan. 20, 2005, entitled "Impurity Doped UV Protection Layer," now U.S. Pat. No. 7,732,923, which claims the benefit of U.S. Provisional Application No. 60/640,695, filed on Dec. 30, 2004, entitled "Impurity Doped UV Protection Layer," which applications are hereby incorporated herein by reference in their entireties.

TECHNICAL FIELD

The present invention relates generally to the fabrication of semiconductor devices, and more particularly to the formation of a material layer for UV protection.

BACKGROUND

Generally, semiconductor devices are fabricated by depositing a plurality of insulating, conductive, and semiconductive material layers over a substrate or workpiece, and patterning the various material layers to form integrated circuits and electrical devices or elements thereon. The conductive, semiconductive, and insulating material layers are patterned using lithography and etched to form integrated circuits (IC's).

A semiconductor workpiece is typically exposed to several types of energy during the fabrication process. Energy sources such as visible light, ultraviolet (UV) light, electron beam and x-ray radiant energy are used in photolithography, for example.

UV light is often used in many curing processes, e.g., for spin-on dielectric layers and/or low dielectric constant insulating materials. UV light has a shorter wavelength than visible light. For example, visible light is typically considered to be light having a wavelength of about 380 to 770 nm, while UV light is usually considered to fall within the wavelength range of about 157 to 400 nm.

A problem with exposing a semiconductor device to LTV light is that the UV light may cause undesired changes to underlying material layers and electrical devices.

Thus, what is needed in the art is a semiconductor device structure and method of manufacturing thereof wherein material layers and electrical devices formed on the semiconductor device are protected from UV light.

SUMMARY OF THE INVENTION

These and other problems are generally solved or circumvented, and technical advantages are generally achieved, by preferred embodiments of the present invention, which provide a novel material layer for UV protection. The UV protection layer is deposited over electrical devices before an insulating material such as a low dielectric constant material is deposited, so that when the low dielectric constant material is cured using UV light, the UV protection layer prevents the UV light from reaching and damaging the underlying electrical devices.

In accordance with a preferred embodiment of the present invention, a method of fabricating a semiconductor device includes providing a workpiece, forming a UV protection layer over the workpiece, and forming a dielectric layer over the UV protection layer.

In accordance with another preferred embodiment of the present invention, a semiconductor device includes a workpiece, a UV protection layer over the workpiece, and a dielectric layer over the UV protection layer.

Advantages of preferred embodiments of the present invention include providing a novel UV protection layer for semiconductor devices. The UV protection layer protects underlying electrical devices from damage during UV light exposure. The UV protection layer advantageously comprises materials compatible with CMOS processing. The UV protection layer protects underlying electrical devices by absorbing at least a portion of the UV light during the UV light exposure. CMOS transistors and other electrical devices with improved performance and reliability may be manufactured in accordance with embodiments of the present invention.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely, the formation of UV protection layers in transistor devices. The invention may also be applied, however, to other semiconductor devices and electrical devices, such as capacitors, diodes, conductive lines, conductive vias, or other circuit elements, as examples.

There is a trend in the semiconductor industry to reduce the size of components, e.g., the critical dimension (CD) of components. As conductive lines are decreased in size, propagation delay and power dissipation become a problem. Copper conductive lines and low dielectric constant materials are being used in back-end-of-the-line (BEOL) interconnect, to reduce wiring propagation delay and power dissipation. A dielectric constant of 2.5 or less is desired in some dielectric material layers, for example.

However, materials having a dielectric constant of 2.5 or less tend to exhibit weak mechanical properties. For example, some low dielectric constant materials may have a hardness of less than about 1.0 Gpa and a modulus of less than about 5 Gpa, for example. In order to achieve a low dielectric constant material with improved hardness, some low dielectric constant materials are formed by depositing a precursor and then exposing the precursor to UV light.

However, a heretofore unrecognized problem is that UV light can damage some underlying material layers, negatively impacting device performance and reliability. For example, it has been discovered by the inventors of the present invention that if a dielectric layer is formed over an electrical device such as a transistor, and the dielectric layer is then cured using UV light, the transistor may be deleteriously affected, e.g., damage may be induced in the transistor by the UV light. A low dielectric constant material dielectric layer may be cured using UV light having a wavelength of about 200 to 300 nm at about 15 minutes, as an example, although alternatively, other UV wavelengths and time durations may be used.

Tests were performed on CMOS transistor devices by the inventors of the present invention before and after curing dielectric layers disposed over the CMOS transistor devices. The CMOS transistor devices included a PMOS and NMOS transistor. Large deviations were seen in the gate oxide thickness at an inversion region $T_{ox\_inv}$ of both the NMOS (0.4 Å) and PMOS (0.2 Å) transistors. A threshold voltage shift was also seen in the NMOS transistor (0.025 V) after the UV light cure process. Furthermore, gate leakage current ($J_g$) was decreased after the UV light cure process by about 15 A/cm$^2$ for both the PMOS and NMOS transistor.

Figure 1:
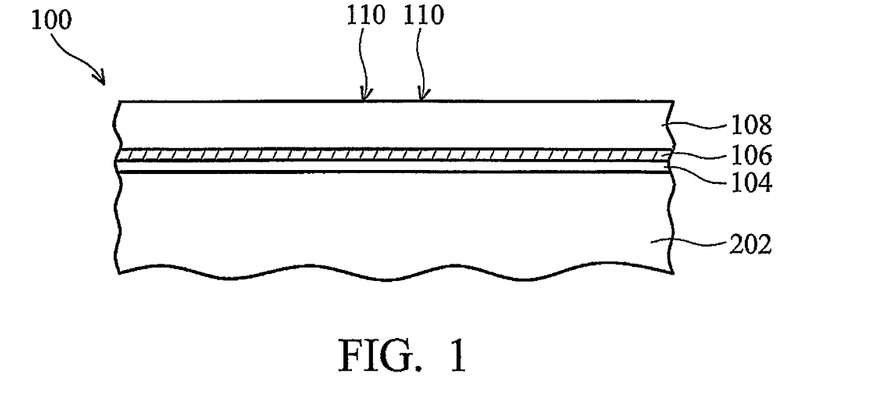
FIG. 1 is a cross-sectional view of an embodiment of the present invention, wherein a UV protection layer is formed over a workpiece.

Embodiments of the present invention prevent damage to electrical devices formed in and over a workpiece by the use of a novel UV protection layer formed over the electrical devices. With reference now to FIG. 1, there is shown a semiconductor device 100 in accordance with a preferred embodiment of the present invention in a cross-sectional view. The semiconductor device 100 includes a workpiece 102. The workpiece 102 may include a semiconductor substrate comprising silicon or other semiconductor materials covered by an optional insulating layer 104, for example. The workpiece 102 may also include other active components, circuits, or electrical devices formed in the front end of line (FEOL), not shown in FIG. 1 (see FIG. 2). The workpiece 102 may comprise silicon oxide over single-crystal silicon, for example. The workpiece 102 may include other conductive layers or other semiconductor elements, e.g., transistors, diodes, resistors, capacitor, conductors, or insulators formed therein, not shown. Compound semiconductors, GaAs, InP, Si/Ge, or SiC, as examples, may be used in place of silicon.

In accordance with a preferred embodiment of the present invention, an ultra-violet (UV) protection layer 106 is formed over the workpiece 102 or optional insulating layer 104. The UV protection layer 106 is adapted to protect active components, circuits, and/or electrical devices formed within or over the workpiece 102 from UV light 110. In one embodiment, the UV protection layer 106 comprises a material that is adapted to absorb UV light 110, for example. The UV protection layer 106 may be formed over or under an etch stop layer, (not shown in FIG. 1; see FIG. 6), for example.

A dielectric layer 108 is formed over the UV protection layer 106, as shown. The dielectric layer 108 may be formed using chemical vapor deposition (CVD) or by spinning on the dielectric layer 108, as examples, although alternatively, other deposition techniques may be used to deposit or form the dielectric layer 108.

The dielectric layer 108 preferably comprises a low dielectric constant material having a dielectric constant of about 3.0 or less, in one embodiment. Alternatively, the dielectric layer 108 may comprise a traditional dielectric material such as silicon oxide or high dielectric constant materials, as examples. In one embodiment, the dielectric layer 108 preferably comprises undoped silicate glass (USG). The dielectric layer 108 may comprise a pre-metal dielectric (PMD) or an inter-level dielectric (ILD), as examples.

The UV protection layer 106 protects the workpiece 102 during exposure to UV light 110 by absorbing at least a portion of the UV light 110, for example. For example, if the dielectric layer 108 is cured using UV light 110, the UV protection layer 106 protects the workpiece 102 during the UV light 110 exposure. Alternatively, the workpiece 102 may be exposed to UV light in a subsequent manufacturing process other than a cure step for the dielectric layer 108. The UV protection layer 106 protects the workpiece 102 during UV light exposures subsequent to the deposition of the UV protection layer 106.

Preferred embodiments of the materials and parameters of the UV protection layer 106 will next be described. The UV protection layer 106 may comprise a single material layer or may comprise two or more material layers. The UV protection layer 106 may be formed using plasma enhanced CVD (PECVD), high density plasma CVD (HDPCVD), atomic layer deposition (ALD), low pressure CVD (LPCVD), or combinations thereof, as examples, although alternatively, other deposition techniques may be used to deposit the UV protection layer 106. The UV protection layer 106 is preferably adapted to prevent UV light 110 from reaching the workpiece 102 or material layer 104. In one embodiment, the UV protection layer 106 is adapted to prevent UV light comprising a wavelength of about 157 nm to about 400 nm from reaching the workpiece 102 and/or material layer 104, as an example, although alternatively, the UV protection layer 106 may protect the workpiece 102 or material layer 104 from other wavelengths of light.

The UV protection layer 106 preferably comprises a thickness of about 50 to 500 Å, as examples, although alternatively, the UV protection layer 106 may comprise other dimensions. The UV protection layer 106 preferably comprises a reflective index (n) of about 1.5 to 2.4, as examples, although alternatively, the UV protection layer 106 may comprise a reflective index having other values. The UV protection layer 106 preferably comprises an absorption coefficient (k) of about 0 to 1.2, as examples, although alternatively, the UV protection layer 106 may comprise an absorption coefficient (k) of other values.

In one embodiment, the UV protection layer 106 preferably comprises at least one layer of silicon or other semiconductor material doped with an impurity. The impurity preferably comprises O, C, H, N, or combinations thereof, as examples, although alternatively, the impurity may comprise other elements. In another embodiment, the UV protection layer 106 preferably comprises SiOC:H (e.g., silicon oxide carbon doped with hydrogen, wherein the oxygen content is greater than the carbon content), SiON, SiN, SiCO:H (e.g., silicon carbon oxide doped with hydrogen, wherein the carbon content is greater than the oxygen content), combinations thereof, or multiple layers thereof, as examples, although alternatively, the UV protection layer 106 may comprise other impurity doped layers of silicon. The UV protection layer 106 may alternatively comprise other impurity doped layers of semiconductive material, such as germanium, as an example.

In one embodiment, the UV protection layer 106 preferably comprises SiOC:H. In this embodiment, the UV protection layer 106 may comprise a reflective index (n) of about 1.8 to 2.3 and an absorption coefficient (k) of about 0 to 1 at a UV light wavelength of about 248 nm, as examples. Also, in this embodiment, the UV protection layer 106 may comprise a reflective index (n) of about 1.6 to 2.0 and an absorption coefficient (k) of about 0 to 1 at about 193 nm, as examples, although alternatively, the reflective index (n) and absorption coefficient (k) may comprise other values.

In another embodiment, the UV protection layer 106 preferably comprises SiON. In this embodiment, the UV protection layer 106 may comprise a reflective index (n) of about 1.8 to 2.3 and an absorption coefficient (k) of about 0 to 1 at a UV light wavelength of about 248 nm, as examples. Also, in this embodiment, the UV protection layer 106 may comprise a reflective index (n) of about 1.6 to 2.0 and an absorption coefficient (k) of about 0 to 1 at about 193 nm, as examples, although alternatively, the reflective index (n) and absorption coefficient (k) may comprise other values.

In another embodiment, the UV protection layer 106 preferably comprises SiN. In this embodiment, the UV protection layer 106 may comprise a reflective index (n) of about 2.2 to 2.4 and an absorption coefficient (k) of about 0 at a UV light wavelength of about 248 nm, as examples. Also, in this embodiment, the UV protection layer 106 may comprise a reflective index (n) of about 2.3 to 2.4 and an absorption coefficient (k) of about 0 to 1 at about 193 nm, as examples. Alternatively, the reflective index (n) and absorption coefficient (k) may comprise other values in this embodiment.

In yet another embodiment, the UV protection layer 106 preferably comprises SiCO:H. In this embodiment, the UV protection layer 106 may comprise a reflective index (n) of about 2.2 to 2.4 and an absorption coefficient (k) of about 0.2 to 0.4 at a wavelength of about 248 nm, as examples. Also, in this embodiment, the UV protection layer 106 may comprise a reflective index (n) of about 1.5 to 2.3 and an absorption coefficient (k) of about 0 to 1.2 at a wavelength of about 193 nm, as examples. Alternatively, the reflective index (n) and absorption coefficient (k) may comprise other values in this embodiment.

FIGS. 2 through 5 show cross-sectional views of a semiconductor device comprising a transistor with a UV protection layer formed at various locations, in accordance with embodiments of the present invention. The novel UV protection layer 206 in accordance with embodiments of the present invention is preferably disposed over the transistor 220, as shown at 206a in FIG. 2, at 206b in FIG. 3, at 206c in FIG. 4, and at 206d in FIG. 5. Like numerals are used for the various elements in FIGS. 2 through 5 as were described with reference to FIG. 1. To avoid repetition, each reference number shown in the diagram may not necessarily be described again in detail herein. Rather, similar materials x02, x04, x06, etc. . . . are preferably used for the materials shown and described with reference to FIG. 1, where x=1 in FIG. 1 and x=2 in FIGS. 2 through 5. As an example, the preferred and alternative materials and dimensions described for the UV protection layer 106 in the description for FIG. 1 are preferably also used for the UV protection layers 206a, 206b, 206c, and 206d shown in FIGS. 2 through 5, respectively.

Figure 2:
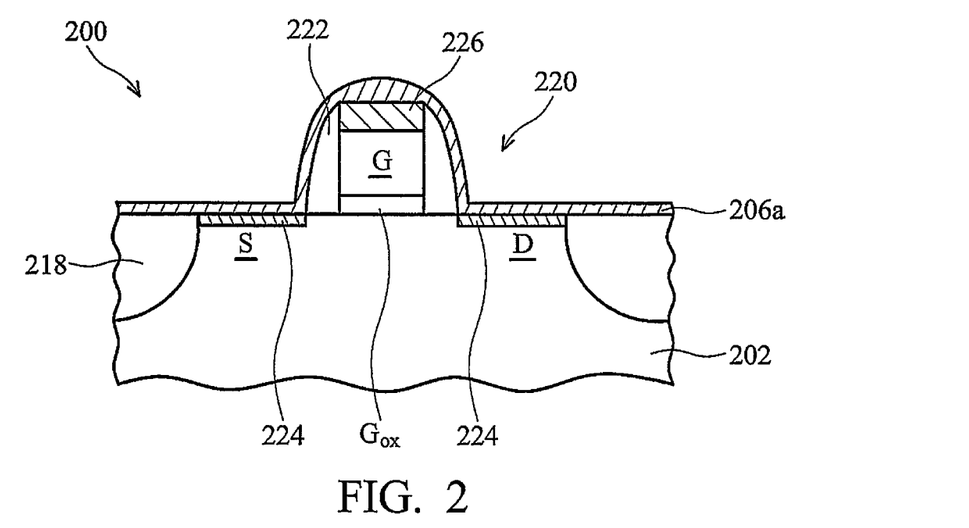
FIGS. 2 through 5 show cross-sectional views of a semiconductor device comprising a transistor with a UV protection layer formed at various locations, in accordance with embodiments of the present invention.

Referring next to FIG. 2, the semiconductor device 200 may include a transistor 220 formed within and over the workpiece 202. The transistor 220 includes a source S and a drain D formed in the workpiece 202. The source S and drain D may be formed by implanting dopants into the workpiece 202, for example. An optional silicide 224 may be formed at the top surface of the source S and drain D, as shown. The transistor 220 includes a gate oxide $G_{ox}$ and a gate G disposed over a channel region of the workpiece 202, wherein the channel region resides between the source S and drain D. The gate G may comprise a semiconductor material such as polysilicon, for example. An optional silicide 226 may be formed at the top surface of the gate G, as shown. Alternatively, the gate G may be fully silicided, for example, not shown. Spacers 222 may be formed over the sidewalls of the gate G, gate oxide $G_{ox}$, and optional silicide 226, as shown. The spacers 222 may comprise an insulator such as an oxide or nitride, for example. A shallow trench isolation region 218 may be disposed on either side of the source S and drain D, as shown.

In accordance with the embodiment of the invention shown in FIG. 2, after the transistor 220 has been formed, a UV protection layer 206a is formed or deposited over the transistor 220. In particular, in this embodiment, the UV protection layer 206a is preferably disposed over and abuts the source S and/or drain D of the transistor 220. If the source S, drain D, or gate G comprise the optional silicide 224 or 226 formed at the top surface thereof, the UV protection layer 206a preferably is disposed over and abuts the silicide 224 and 226, as shown. In this embodiment, the UV protection layer 206a is preferably formed after the silicide 224 and 226 formation and before a contact etch stop layer is deposited over the transistor 220. If no silicide 226 is present on top of the gate G, preferably, the UV protection layer 206a is disposed over and abuts the gate G of the transistor 220.

Figure 3:
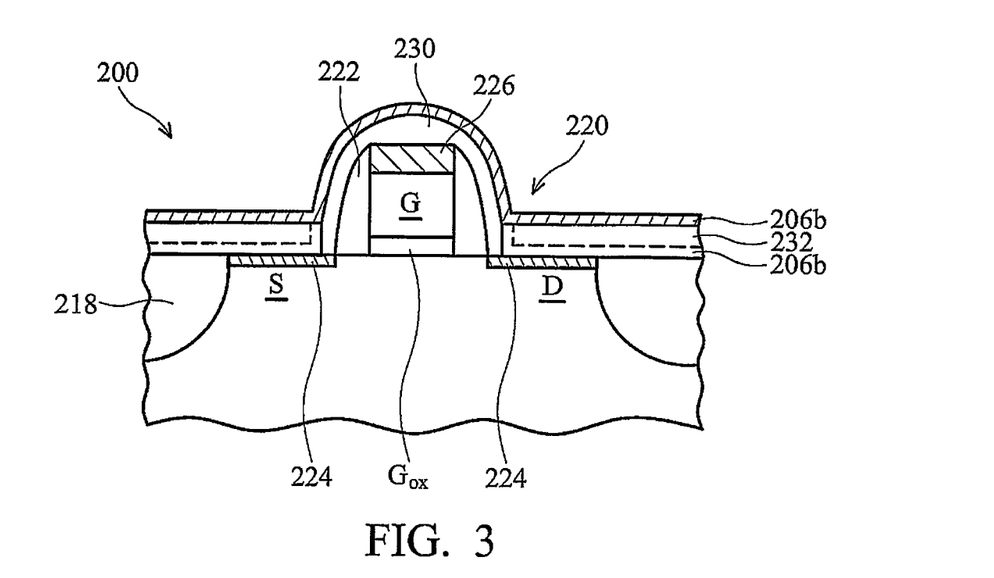

In accordance with another embodiment of the present invention, as shown in FIG. 3, a UV protection layer 206b is formed over the transistor 220 after the formation of a contact etch stop layer 230 is formed over at least the gate G. The contact etch stop layer 230 may be formed over the sidewall spacers 222 and the gate G, e.g., over and abutting either the gate G or the optional silicide 226. The contact etch stop layer 230 may comprise an insulator such as a nitride, for example. The contact etch stop layer 230 is used as an etch stop in later processing steps, when electrical contact is made to the gate G of the transistor, for example. In this embodiment, the UV protection layer 206b may be formed before (shown in phantom) or after an optional insulating layer 232 is disposed over the workpiece 202, for example. Also, in this embodiment, the UV protection layer 206b is preferably formed over and abutting the contact etch stop layer 230, as shown. The UV protection layer 206b conforms to the shape of the underlying contact etch stop layer 230 in this embodiment. A pre-metal dielectric (PMD) may be disposed over the UV protection layer 206b (not shown in FIG. 3; see FIG. 6 at 336).

Figure 4:
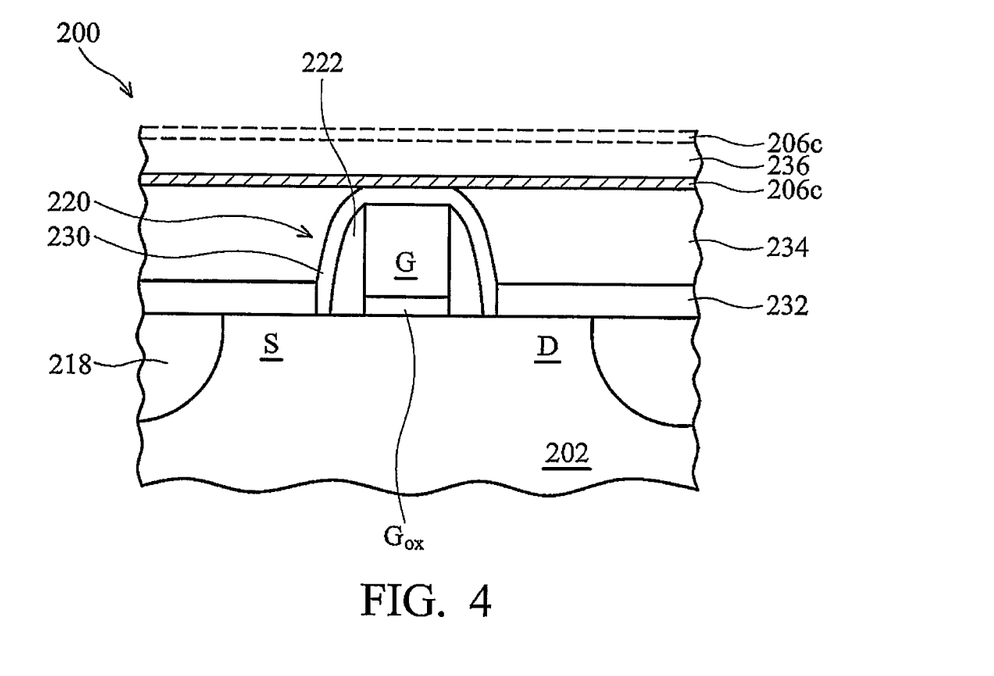

In another embodiment, shown in FIG. 4, an optional insulating layer 234 is deposited over the optional insulating layer 232. The insulating layer 234 provides a planar surface for subsequently deposited material layers, which may comprise conductive lines and vias, for example. The insulating layer 234 may be deposited to completely cover the contact etch stop layer 230 (not shown), and may be chemical mechanical polished (CMP) or etched back to remove the insulating layer 234 from the top surface of the contact etch stop layer 230, as shown. A UV protection layer 206c is then formed over the optional insulating layer 234 and the exposed contact etch stop layer 230. An etch stop layer 236 may be formed over the UV protection layer 206c, as shown. In one embodiment, the UV protection layer 206c is formed over the etch stop layer 236, after the etch stop layer 236 is deposited over the optional insulating layer 234 and the contact etch stop layer 230, as shown in phantom in FIG. 4. A pre-metal dielectric may then be formed over the etch stop layer 236, not shown.

Figure 5:
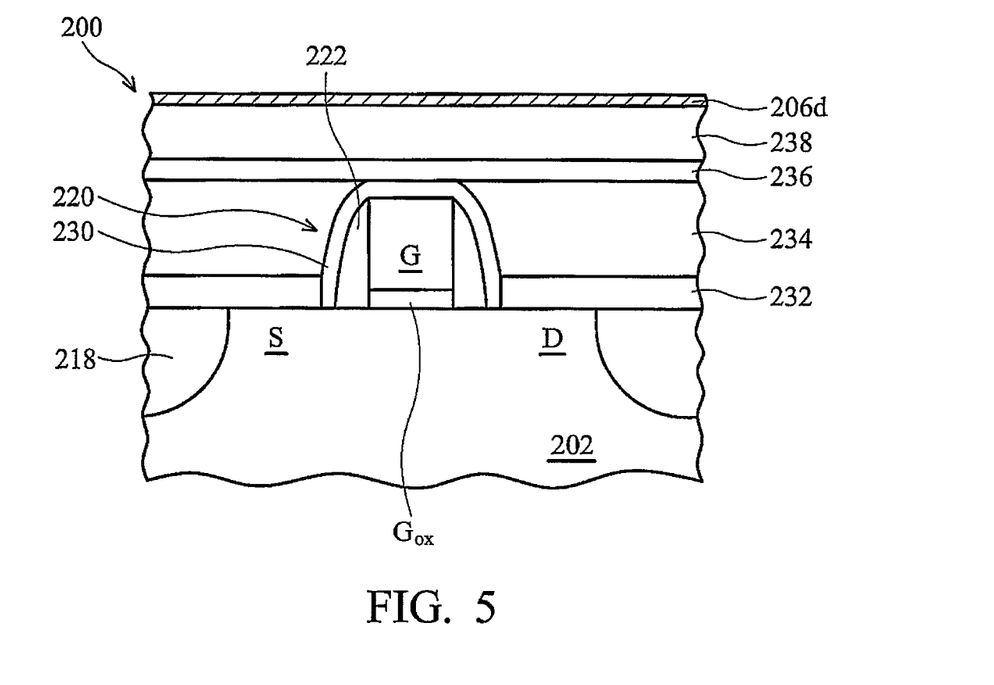

In another embodiment, the UV protection layer 206d may be formed over a pre-metal dielectric 238, as shown in FIG. 5. The pre-metal dielectric 238 may be formed over an etch stop layer 236, for example. An inter-metal dielectric (IMD) may then be formed over the pre-metal dielectric 238 (not shown). In one embodiment, the UV protection layer 206d may be formed within the pre-metal dielectric 236 (not shown).

Figure 6:
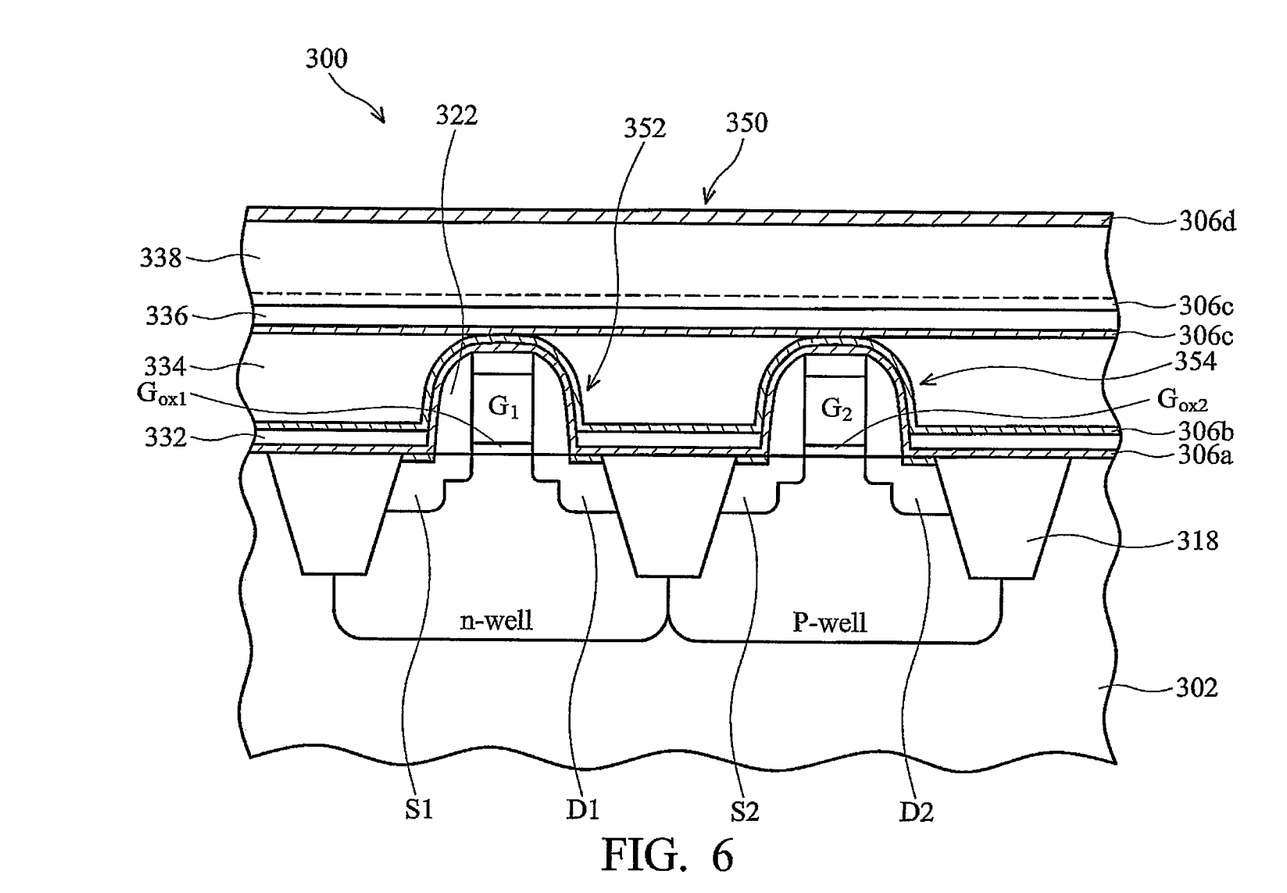
FIG. 6 is a cross-sectional view of a semiconductor device comprising a CMOS transistor having a plurality of UV protection layers formed therein.

A UV protection layer may be formed in one or more locations of a semiconductor device in accordance with embodiments of the present invention. FIG. 6 is a cross-sectional view of a semiconductor device comprising a CMOS transistor having a plurality of UV protection layers. Again, like numerals and letters are used for the various elements in FIG. 6 as were used in FIG. 1 and FIGS. 2 through 5, and to avoid repetition, each reference number shown in the diagram may not necessarily be described again in detail herein. Rather, similar materials x02, x04, x06, etc. . . . are preferably used for the materials shown and described with reference to FIG. 1 and FIGS. 2 through 5, where x=1 in FIG. 1, x=2 in FIGS. 2 through 5, and x=3 in FIG. 6.

In this embodiment, the semiconductor device 300 comprises a complimentary metal oxide semiconductor (CMOS) device 350. The CMOS device 350 includes an NMOS transistor 352 and a PMOS transistor 354, as shown. In accordance with preferred embodiments of the present invention, at least one UV protection layer 306a, 306b, 306c, and 306d is formed over the CMOS device 350. An inter-metal dielectric layer (not shown) may be deposited over the pre-metal dielectric layer 338 or top UV protection layer 306d. The inter-metal dielectric layer may comprise a dielectric material that is cured using a UV light, for example, and the at least one UV protection layer 306a, 306b, 306c and/or 306d protects the NMOS transistor 352 and the PMOS transistor 354 from damage during the UV light exposure. Alternatively, the pre-metal dielectric 338 and optional insulating layers 332 or 334 may comprise a dielectric material that is cured using a UV light, for example.

Advantages of preferred embodiments of the present invention include providing a novel UV protection layer 106, 206a, 206b, 206c, 206d, 306a, 306b, 306c, and/or 306d for semiconductor devices. The UV protection layers 106, 206a, 206b, 206c, 206d, 306a, 306b, 306c, and/or 306d protect underlying electrical devices 220 or 350 from damage during UV light exposure. The UV protection layers 106, 206a, 206b, 206c, 206d, 306a, 306b, 306c, and/or 306d advantageously comprise materials compatible with CMOS processing. The UV protection layers 106, 206a, 206b, 206c, 206d, 306a, 306b, 306c, and/or 306d protect underlying electrical devices by absorbing at least a portion of the UV light during the UV light exposure. CMOS transistors 350 and other electrical devices with improved performance and reliability may be manufactured in accordance with embodiments of the present invention. In particular, a CMOS device 350 having more robust performance in the parameters of gate oxide thickness at an inversion region and threshold voltage. Shifts in threshold voltages are avoided, and concerns about the reliability of gate oxide integrity (GOI), negative bias temperature instability (NBTI), and hot carrier are reduced or eliminated. Furthermore, no extra tools are required to form the novel UV protection layers 106, 206a, 206b, 206c, 206d, 306a, 306b, 306c, and/or 306d described herein.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of fabricating a semiconductor device, the method comprising:
    forming a non-planar etch stop layer over a workpiece, over a top surface of a gate electrode, and over a gate sidewall spacer, the non-planar etch stop layer not extending planarly in a direction parallel to a top surface of the workpiece;
    forming a first ultra-violet (UV) protection layer over the non-planar etch stop layer, the first UV protection layer abutting the non-planar etch stop layer and being planar;
    forming a dielectric layer over the first UV protection layer;
    exposing a bulk portion of the dielectric layer to UV light to cure the dielectric layer, wherein the first UV protection layer absorbs at least a portion of the UV light; and
    forming a second UV protection layer over the dielectric layer.

2. The method according to claim 1, further comprising forming an electrical device within or over the workpiece, the electrical device comprising the gate electrode, wherein forming the first UV protection layer comprises forming the first UV protection layer over the electrical device, further comprising exposing the dielectric layer to UV light, wherein the first UV protection layer protects the electrical device from the UV light by absorbing at least a portion of the UV light.

3. The method according to claim 1, wherein forming the dielectric layer comprises chemical vapor deposition (CVD) of the dielectric layer or spinning on the dielectric layer, and wherein forming the first UV protection layer comprises using plasma enhanced CVD (PECVD), high density plasma CVD (HDPCVD), atomic layer deposition (ALD), low pressure CVD (LPCVD), or a combination thereof.

4. The method according to claim 1, further comprising forming a transistor within and over the workpiece, the transistor comprising the gate electrode, wherein forming the first UV protection layer comprises forming the first UV protection layer over the transistor.

5. The method according to claim 1, further comprising:
    forming a transistor within and over the workpiece, the transistor comprising the gate electrode.

6. The method according to claim 1, further comprising:
forming a transistor within and over the workpiece, the transistor comprising the gate electrode; and
forming a pre-metal dielectric (PMD) over the non-planar etch stop layer, wherein forming the first UV protection layer comprises forming the first UV protection layer within the pre-metal dielectric.

7. The method according to claim 1, further comprising:
forming a transistor within and over the workpiece, the transistor comprising the gate electrode; and
forming a pre-metal dielectric (PMD) over the non-planar etch stop layer, wherein forming the first UV protection layer comprises forming the first UV protection layer over the pre-metal dielectric.

8. The method according to claim 1, further comprising: forming an inter-metal dielectric (IMD) over the workpiece, wherein forming the first UV protection layer comprises forming the first UV protection layer within the inter-metal dielectric.

9. The method according to claim 1, further comprising forming an inter-metal dielectric (IMD) over the first UV protection layer.

10. The method according to claim 1, wherein forming the first UV protection layer comprises forming a layer comprising a thickness of about 50 to 500 Å.

11. The method according to claim 1, wherein forming the first UV protection layer comprises forming a layer comprising a reflective index (n) of about 1.5 to 2.4.

12. The method according to claim 1, wherein forming the first UV protection layer comprises forming a layer comprising an absorption coefficient (k) of about 0 to 1.2.

13. The method according to claim 1, wherein forming the first UV protection layer comprises forming a layer comprising two or more layers of material.

14. The method according to claim 1, wherein forming the first UV protection layer comprises forming a UV protection layer comprising SiOC:H, SiON, SiN, SiCO:H, combinations thereof, or multiple layers thereof.

15. The method according to claim 1, wherein forming the first UV protection layer comprises forming at least one layer of silicon doped with an impurity.

16. The method according to claim 15, wherein the impurity comprises O, C, H, N, or combinations thereof.

17. A method of fabricating a semiconductor device, the method comprising:
forming a non-planar etch stop layer over a workpiece, over a top surface of a gate electrode, and over a gate sidewall spacer, the non-planar etch stop layer not extending planarly in a direction parallel to a top surface of the workpiece, the gate sidewall spacer not extending over the top surface of the gate electrode, the gate sidewall spacer being disposed laterally between the gate electrode and a portion of the non-planar etch stop layer;
forming an ultra-violet (UV) protection layer over the etch stop layer, the UV protection layer abutting the etch stop layer, wherein the forming the UV protection layer comprises using an atomic layer deposition process;
forming a dielectric layer over the UV protection layer; and
curing the dielectric layer over the UV protection layer with UV radiation, at least a portion of the UV radiation being absorbed by the UV protection layer beneath the dielectric layer.

18. The method of claim 17, wherein a portion of the UV protection layer abuts the top surface of the workpiece.

19. A method of fabricating a semiconductor device, the method comprising:
forming an etch stop layer over a workpiece, over a top surface of a gate electrode, and over a gate sidewall spacer, the etch stop layer comprising a first non-planar portion, the gate sidewall spacer not extending over the top surface of the gate electrode, the gate sidewall spacer being disposed laterally between the gate electrode and at least part of the first non-planar portion;
forming a first dielectric layer over the workpiece and adjoining at least some of the etch stop layer;
forming an ultra-violet (UV) protection layer over the etch stop layer and the first dielectric layer, the UV protection layer comprising a second non-planar portion abutting and conforming to at least some of the first non-planar portion of the etch stop layer;
forming a second dielectric layer over the UV protection layer; and
curing the second dielectric layer with a UV radiation, at least a portion of the UV radiation extending through the second dielectric layer and being absorbed by the UV protection layer.

* * * * *